US011948721B2

(12) United States Patent
Kao et al.

(10) Patent No.: US 11,948,721 B2
(45) Date of Patent: Apr. 2, 2024

(54) PACKAGED ISOLATION BARRIER WITH INTEGRATED MAGNETICS

(71) Applicant: TEXAS INSTRUMENTS INCORPORATED, Dallas, TX (US)

(72) Inventors: Ying-Chuan Kao, Taipei (TW); Hung-Yu Chou, Taipei (TW); Dong-Ren Peng, New Taipei (TW); Jun Jie Kuo, New Taipei (TW); Kenji Otake, Nagano (JP); Chih-Chien Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 603 days.

(21) Appl. No.: 16/883,614

(22) Filed: May 26, 2020

(65) Prior Publication Data

US 2021/0375525 A1 Dec. 2, 2021

(51) Int. Cl.
*H01F 27/28* (2006.01)
*H01F 19/08* (2006.01)
*H01L 23/64* (2006.01)
*H01L 49/02* (2006.01)

(52) U.S. Cl.
CPC ....... *H01F 27/2804* (2013.01); *H01L 23/645* (2013.01); *H01L 28/10* (2013.01); *H01F 2019/085* (2013.01); *H01F 2027/2809* (2013.01)

(58) Field of Classification Search
CPC .......... H01F 27/2804; H01F 2019/085; H01F 2027/2809; H01L 23/645; H01L 28/10
See application file for complete search history.

(56) References Cited

U.S. PATENT DOCUMENTS

| 7,463,131 | B1 * | 12/2008 | Hwang | ............... H01F 17/0006 336/200 |
| 9,035,422 | B2 | 5/2015 | Khanolkar et al. | |
| 10,090,769 | B2 | 10/2018 | Baranwal et al. | |
| 10,199,154 | B2 * | 2/2019 | Hong | .................. H01F 17/0013 |
| 10,497,506 | B2 | 12/2019 | Massolini et al. | |
| 2019/0097544 | A1 | 3/2019 | Albertini et al. | |
| 2020/0006245 | A1 * | 1/2020 | Chuang | ................... H01L 24/48 |

OTHER PUBLICATIONS

UCC12050 High-Efficiency, Low-EMI, 5-kV RMS Reinforced Isolation DC-DC Converter, Texas Instruments Incorporated, Dallas, Texas, Dec. 2019.

* cited by examiner

*Primary Examiner* — Andrea Lindgren Baltzell
*Assistant Examiner* — Kimberly E Glenn
(74) *Attorney, Agent, or Firm* — Ronald O. Neerings; Frank D. Cimino

(57) ABSTRACT

An apparatus includes a laminate, the laminate including a dielectric layer having a first surface and a second surface opposed to the first surface, and a conductive layer forming a circuit element overlying the first surface of the dielectric layer. The apparatus further includes a magnetic layer over the conductive layer. A first edge surface of the magnetic layer is coplanar with a first edge surface of the laminate, and a second edge surface of the magnetic layer is coplanar with a second edge surface of the laminate.

20 Claims, 11 Drawing Sheets

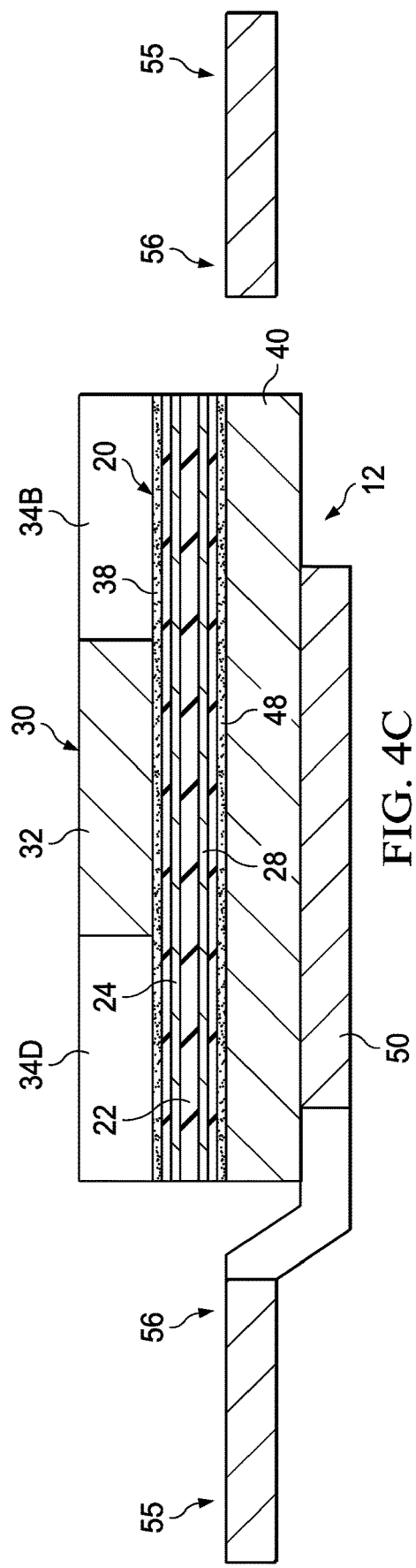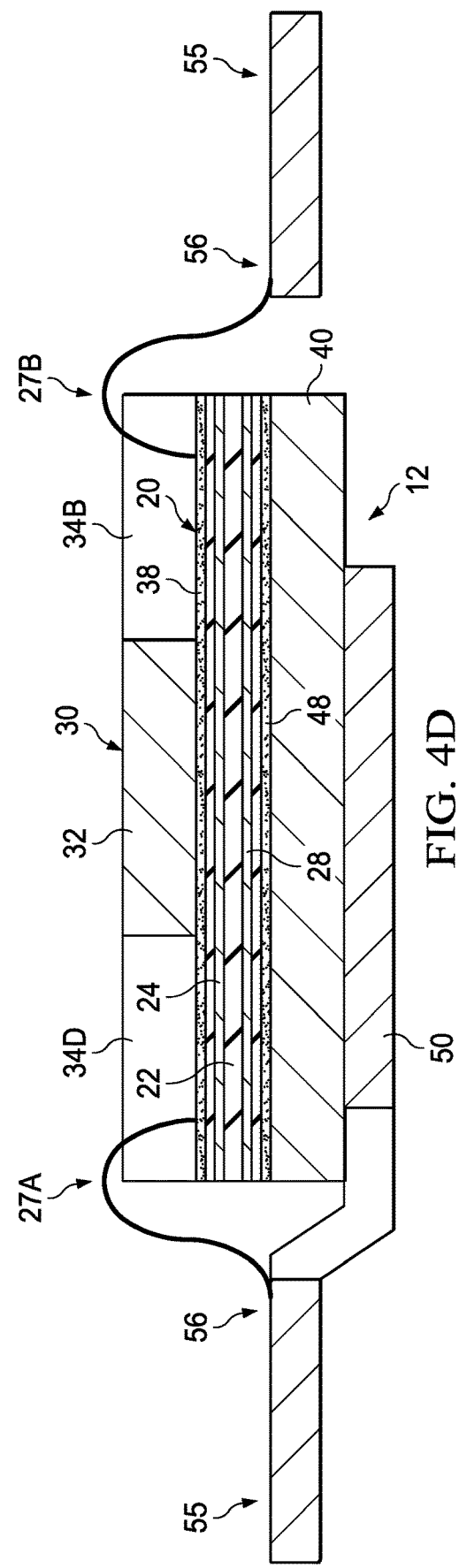

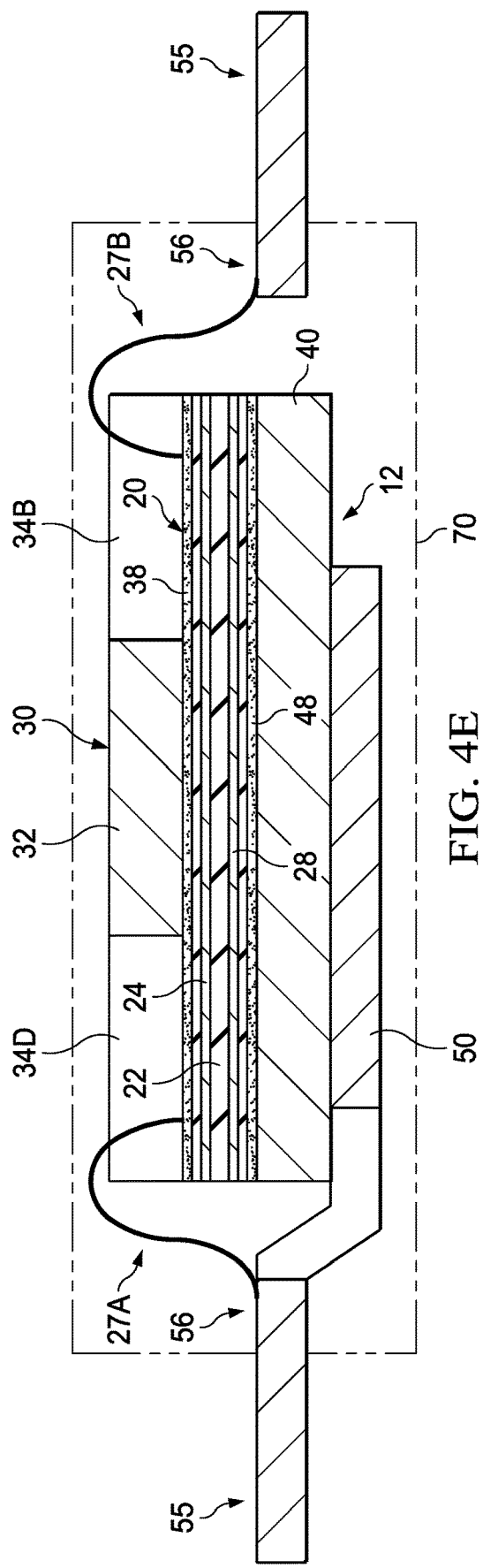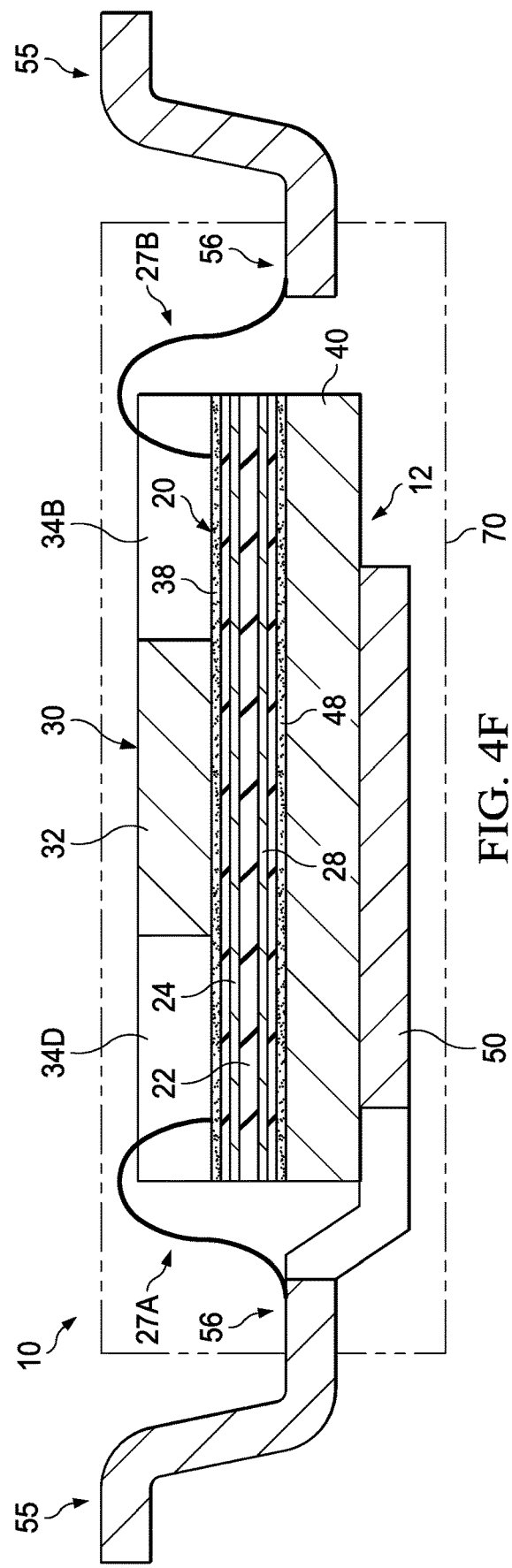

PACKAGED ISOLATION BARRIER WITH INTEGRATED MAGNETICS

TECHNICAL FIELD

This disclosure relates to electronic packages.

BACKGROUND

Electronic package technology continues trends towards miniaturization, integration, and speed. Galvanic isolation between electrical systems is importance in modern industrial equipment, and with low voltage microprocessor systems used to control higher voltage systems. There are various existing elements that can isolate the systems electrically but that still allow coupling. Those elements may include a transformer to couple circuits magnetically, a radio frequency (RF) signal to couple through a radiated energy, an opto-isolator using light energy or a capacitor using an electric field to couple circuits having differing operating voltages.

Although opto-isolators are a good solution for low speed communication, they are inefficient in direct current (DC) to DC power transfer cases. Transformers provide galvanic isolation in DC to DC applications, but traditional transformers can be expensive because of the winding structures and the amount of board space and package height consumed. Printed transformers, such as those printed on a printed circuit board (PCB) use a large footprint on the circuit board and can also suffer degradation due to moisture or other contaminant absorption over time, resulting in higher leakages and lowered break down isolation capability.

BRIEF SUMMARY

Packages disclosed herein include magnetic material on one or both sides of a laminate circuit, such as a laminate including transformer coils forming a transformer which provides galvanic isolation between two circuits. The magnetic material may be configured to shape magnetic flux for increased performance and enhanced thermal conductivity for the transformer. Also disclosed are techniques for bulk manufacturing an array of such laminate magnet assemblies. The disclosed techniques include forming an assembly with a laminate with a circuit element sandwiched between two arrays of interconnected magnetic elements. Singulation of laminate magnet assemblies from the assembled array includes cutting the laminate and the interconnected magnetic elements in unison.

In one example, an apparatus includes a laminate, the laminate including a dielectric layer having a first surface and a second surface opposed to the first surface, and a conductive layer forming a circuit element overlying the first surface of the dielectric layer. The apparatus further includes a magnetic layer over the conductive layer. A first edge surface of the magnetic layer is coplanar with a first edge surface of the laminate, and a second edge surface of the magnetic layer is coplanar with a second edge surface of the laminate.

In another example, an apparatus includes a laminate, the laminate including a dielectric layer having a first surface and a second surface opposed to the first surface, a first conductive layer forming a first transformer coil overlying the first surface of the dielectric layer, and a second conductive layer forming a second transformer coil overlying the second surface of the dielectric layer. The apparatus further includes a first magnetic layer over the first conductive layer. A first edge surface of the first magnetic layer is coplanar with a first edge surface of the laminate, and a second edge surface of the first magnetic layer is coplanar with a second edge surface of the laminate. The apparatus further includes a second magnetic layer over the second conductive layer. A first edge surface of the second magnetic layer is coplanar with the first edge surface of the laminate, and a second edge surface of the second magnetic layer is coplanar with the second edge surface of the laminate.

In another example, a method includes attaching a patterned magnetic layer to a laminate with an adhesive to form a laminate magnet assembly. The laminate includes a dielectric layer having a first surface and a second surface opposed to the first surface, and a conductive layer forming an array of circuit elements and bond pads overlying the first surface of the dielectric layer, the bond pads providing electrical connections to each of the array of circuit elements. The patterned magnetic layer includes openings with the bond pads exposed within the openings. The method further includes cutting the attached patterned magnetic layer and the laminate in unison to form laminate magnet assemblies, each of the laminate magnet assemblies including singulated circuit elements with magnets cut from the patterned magnetic layer attached to the singulated circuit elements with the adhesive.

BRIEF DESCRIPTION OF THE DRAWINGS

FIGS. 4A-4F illustrate conceptual process steps for batch manufacturing the semiconductor package of FIGS. 1A-1C using the assembly of FIG. 3.

DETAILED DESCRIPTION

As disclosed herein, a package may include magnetic material on either side of a laminate including a circuit element, such as a laminate including inductively coupled coils configured as a transformer which provides galvanic isolation. The magnetic material may be configured to shape magnetic flux for increased performance and enhanced thermal conductivity for the transformer. Also disclosed are techniques for batch manufacturing an array of laminate circuit elements and magnet assemblies. The disclosed techniques include forming an assembly including a laminate with an array of circuit elements, sandwiched between two layers of magnetic material. Singulation of the circuit elements from the assembled array includes cutting the laminate and layers of magnetic material in unison. Package 10, as described with respect to FIGS. 1A-1C, represents one example of these techniques.

Figure 1A:
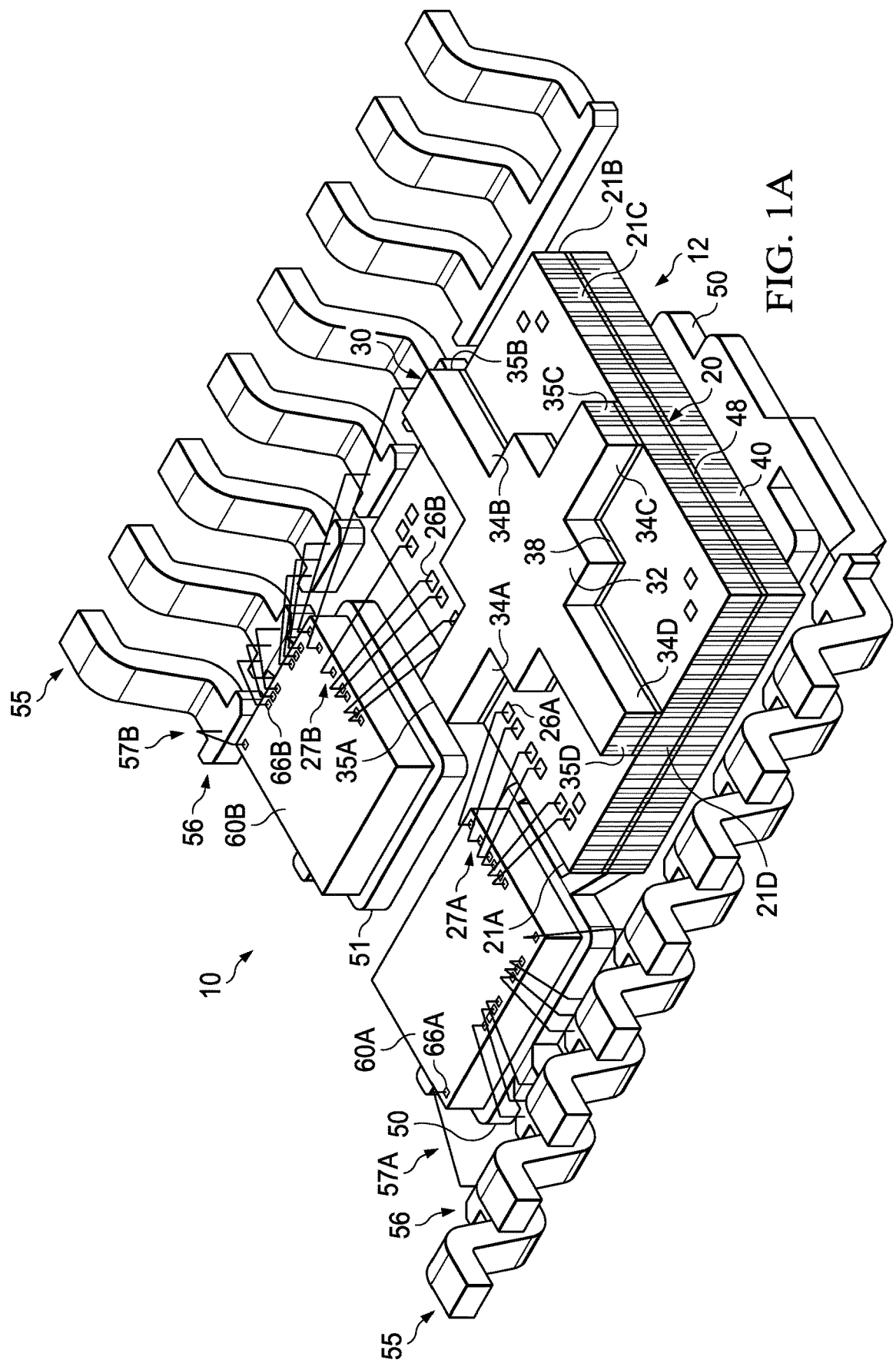
FIGS. 1A-1C illustrate a package including an apparatus with magnetic material on both sides of a laminate circuit attached to a leadframe.
Figure 1B:
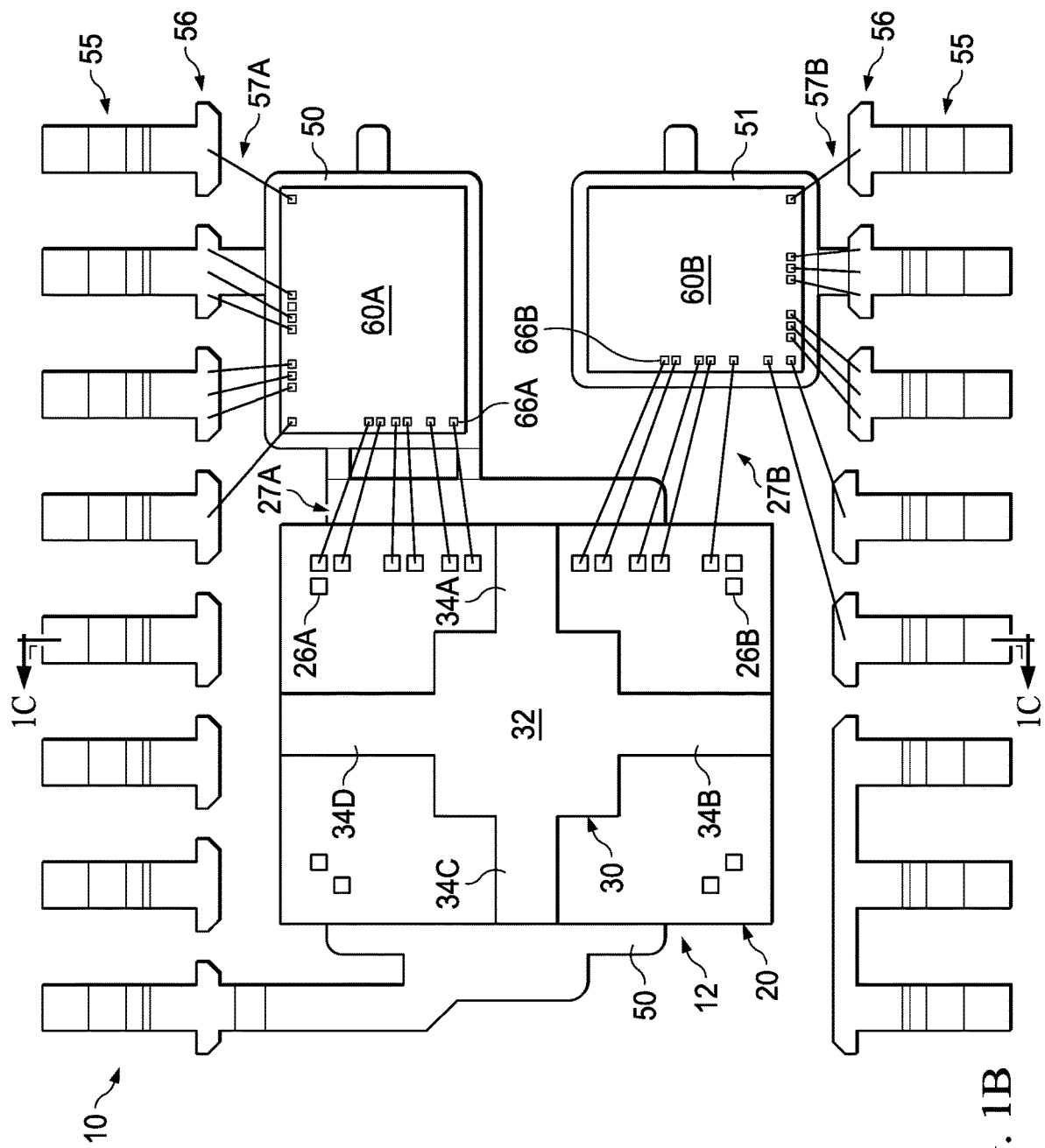
Figure 1C:
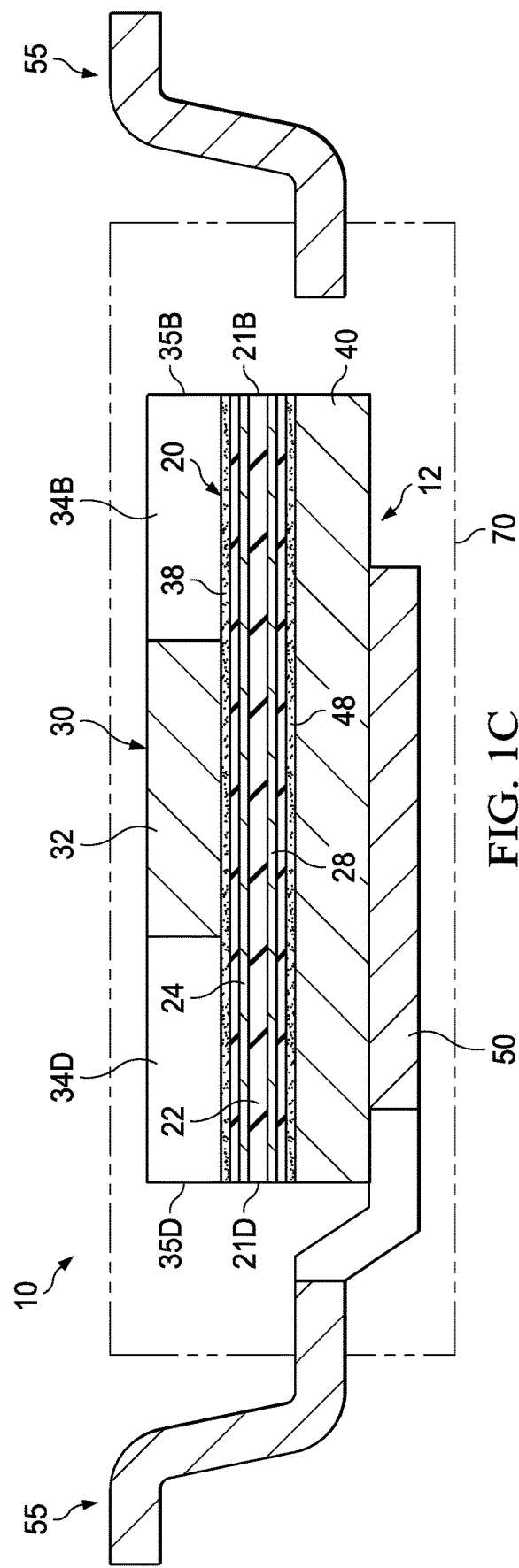

FIGS. 1A-1C illustrate package 10. In particular, FIG. 1A is a perspective view of package 10, while FIG. 1B is a bottom view of package 10. FIG. 1C is a cross-sectional view of package 10 as indicated on FIG. 1B.

Package 10 includes a laminate 20, with patterned magnetic layer 30 and magnetic layer 40 attached on either side of laminate 20, representing a laminate magnet assembly 12. As referred to herein, magnets and magnetic material, including magnetic layer 30, 40, represent permanent magnets as opposed to electro magnets. Package 10 further includes a leadframe with metallic pads 50, 51 and leads 55. Semiconductor dies 60A, 60B are mounted to the leadframe and electrically connected to laminate 20. In a specific example of package 10, laminate 20 includes an isolation transformer for signals between semiconductor dies 60A, 60B. Magnetic layers 30, 40 may be configured to confine and focus flux between transformer coils of the isolation transformer.

Figure 6:
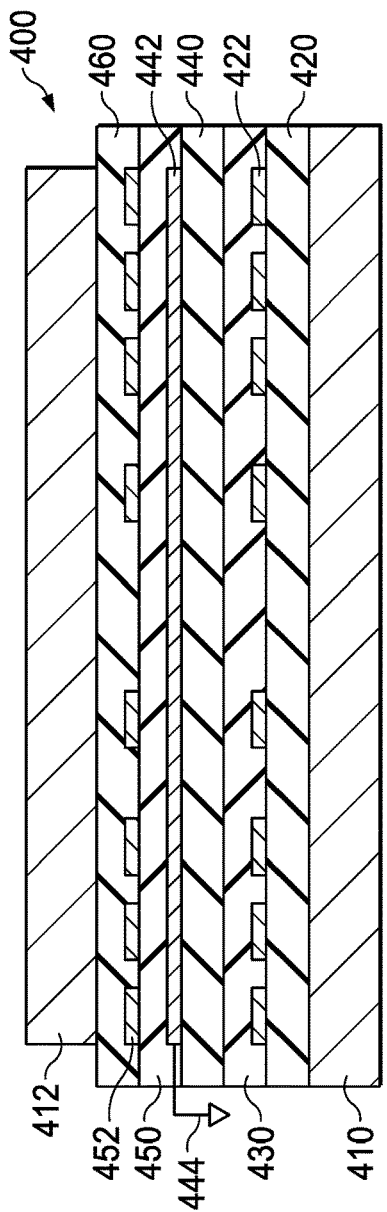
FIG. 6 depicts in a cross sectional view an arrangement including a printed circuit isolation transformer arrangement incorporating aspects of the present application.

Laminate 20 includes a dielectric core 22 having opposed planar surfaces including a first surface and a second surface opposed to the first surface. A first conductive layer 24 forming a first circuit element, such as a transformer coil, overlies the first surface of dielectric core 22, and a second conductive layer 28 forming a second circuit element, such as a transformer coil, overlies the second surface of dielectric core 22. In some examples, magnetic layers 30, 40 may be configured to confine and focus flux between such transformer coils to increase an effective inductance between the transformer coils, such as increase the effective inductance by at least a factor of two. In the same or different examples, laminate 20 may include additional laminations, such as described with respect to printed circuit transformer 400 (FIG. 6).

Patterned magnetic layer 30 is over conductive layer 24 and secured to laminate 20 with adhesive film 38. Likewise, magnetic layer 40 is over conductive layer 28 and secured to laminate 20 with adhesive film 48. As described with respect to FIG. 3, such adhesive films may be incorporated into a batch manufacturing process to attach magnetic layers to an array of laminate circuit elements. Adhesive films 38, 48 are structurally different from liquid adhesives such as epoxy at least in that there is little or no fillet surrounding the edges of magnetic layers 30, 40. Instead, the thicknesses of adhesive films 38, 48 are relatively consistent on the surfaces of laminate 20. In contrast, a liquid adhesive or epoxy precursor would form a fillets extending up the side edges of magnetic layers 30, 40 prior to solidification. In some examples, alternative adhesive layers may be used instead of adhesive films 38, 48. Such alternatives include liquid adhesives, such a epoxies, and precured adhesives.

Patterned magnetic layer 30 is shaped to as to not cover bond pads 26A, 26B. Specifically, patterned magnetic layer 30 includes a first tie bar segment 34A forming a first edge surface 35A of patterned magnetic layer 30, a second tie bar segment 34B forming a second edge surface 35B of patterned magnetic layer 30, a third tie bar segment 34C forming a third edge surface 35C of patterned magnetic layer 30, a fourth tie bar segment 34D forming a fourth edge surface 35D of patterned magnetic layer 30. Tie bar segments 34A, 34B, 34C, 34D are connected by a center portion 32 between tie bar segments 34A, 34B, 34C, 34D. In the illustrated example, center portion 32 is wider than any of tie bar segments 34A, 34B, 34C, 34D.

Figure 3:
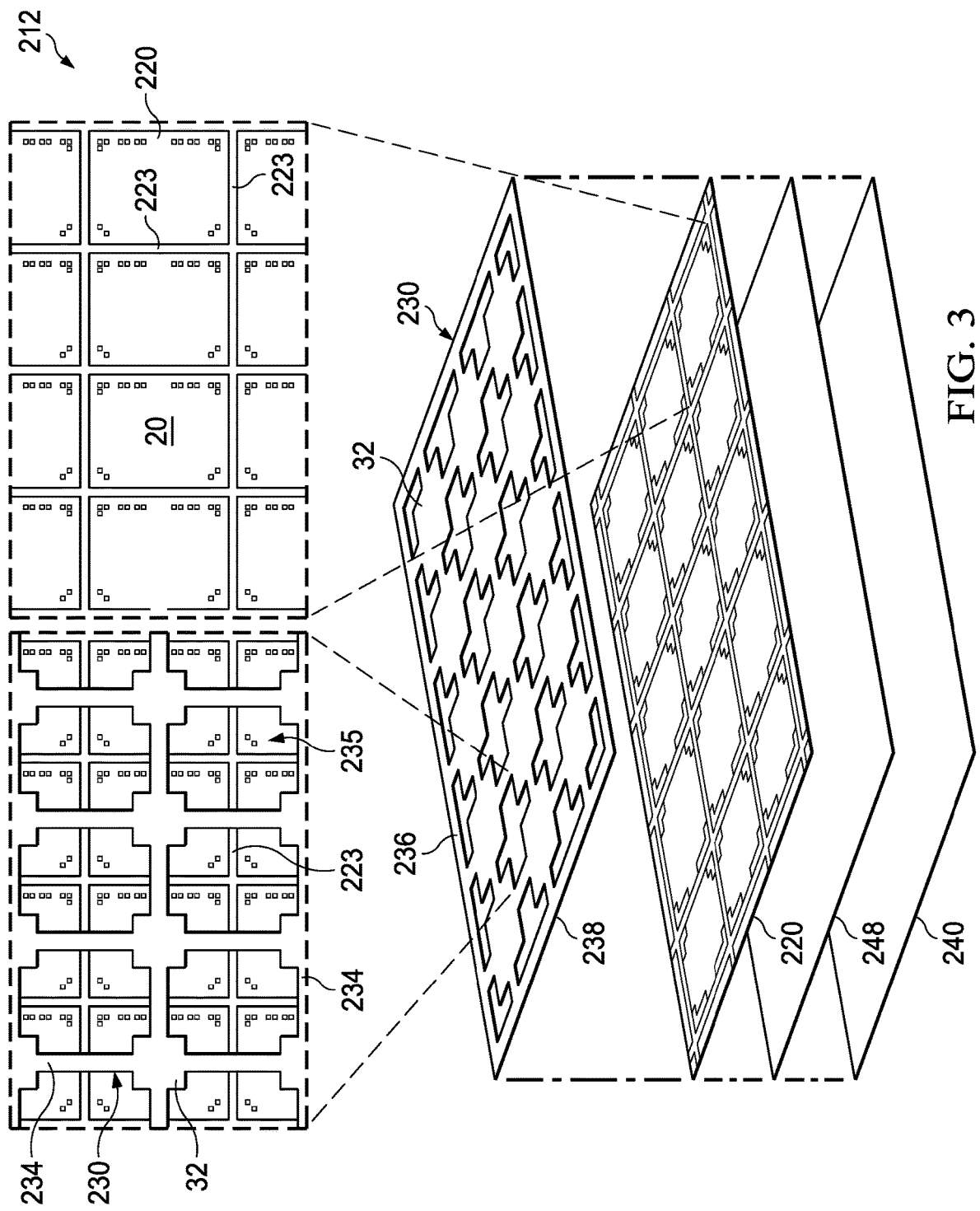
FIG. 3 illustrates an assembly including a laminate with an array of circuit elements, with a patterned magnetic layer, and a second magnetic layer attached to the laminate prior to singulation of the circuit elements.

As described with respect to FIG. 3, magnetic layers 30, 40 may attached to laminate 20 and then cut in unison with laminate 20 to form laminate magnet assembly 12. Such a process results in edge surfaces of magnetic layers 30, 40 being in alignment, such as coplanar, with edge surfaces of laminate 20. Specifically, laminate edge surfaces 21A, 21B, 21C, 21D are coplanar with tie bar segment edge surfaces 35A, 35B, 35C, 35D, respectively. Likewise, edge surfaces of magnetic layer 40 are also coplanar with laminate edge surfaces 21A, 21B, 21C, 21D. Cutting marks, such as grooves or other minute surface imperfections, may extend across the first edge surface of patterned magnetic layer 30 and the first edge surface of laminate 20, the cutting marks indicating patterned magnetic layer 30 and laminate 20 were assembled prior to a cutting operation forming the cutting marks. The cutting marks may further indicate the manufacturing process used to form the cutting, as cutting marks from saw cutting would be different than cutting marks from laser cutting. For example, a saw cut leaves imprints of the edge saw teeth, while a laser cut leaves marks reflecting the intensity, size and shape of the cutting laser. Moreover, while saw cutting marks reflect the direction of travel of the cutting teeth relative the surface, which may be portion of a circular cutting path, a laser cutting marks are generally straight.

Metallic pads 50, 51 and leads 55 represent the leadframe of package 10. Laminate 20 with magnetic layers 30, 40 and semiconductor die 60A are mounted to metallic pad 50, and semiconductor die 60B is mounted metallic pad 51. Metallic pad 51 is electrically isolated from metallic pad 50 to support the galvanic isolation provided by laminate 20 between semiconductor dies 60A, 60B.

Conductive layer 24 of laminate 20 forms a first set of bond pads 26A providing electrical connections to the first circuit element and a second set of bond pads 26B providing electrical connections to the second circuit element. Similarly, semiconductor dies 60A, 60B include bond pads 66A, 66B, respectively. Bond pads 26A, 26B of laminate 20 are electrically connected to a subset of bond pads 66A, 66B of semiconductor dies 60A, 60B by way of wire bonds 27A, 27B, with each wire bond 27A extending between one of bond pads 26A and one of bond pads 66A, and each wire bond 27B extending between one of bond pads 26B and one of bond pads 66B. In addition, wire bonds 57A each extend between one of bond pads 66A one of lead bond pads 56 of leads 55, and wire bonds 57B each extend between one of bond pads 66B one of lead bond pads 56 of leads 55.

In this manner, wire bonds 27A electrically connect semiconductor die 60A and laminate 20, whereas wire bonds 27B electrically connect semiconductor die 60B and laminate 20. No wire bonds or other direct electrical connections extend between semiconductor dies 60A and 60B. Instead, laminate 20 provides an isolation circuit to facilitate signal transmission between semiconductor dies 60A and 60B. Meanwhile, wire bonds 57A and 57B serve as the electrical connections between leads 55 and semiconductor dies 60A and 60B, respectively.

In the example of package 10, leads 55 are shaped as cantilevered leads to facilitate surface mounting of package 10. In other examples, leads 23 may have other configurations, including but not limited to, a shape conforming to Small Outline No-Lead (SON) devices or flat leads or pins, such as with a Quad Flat No-Lead (QFN) package.

Mold compound 70 (FIG. 1C) covers laminate magnet assembly 12, semiconductor dies 60A, 60B, wire bonds 27A, 27B, 57A, 57B, and at least partially covers metallic pad 50 and leads 55. In this manner, mold compound 70 provides a protective outer layer for the electric components of package 10. In some examples, mold compound 70 includes an epoxy such as an epoxy-based thermoset polymer. For simplicity, mold compound 70 is not shown in FIGS. 1A and 1B.

Figure 2:
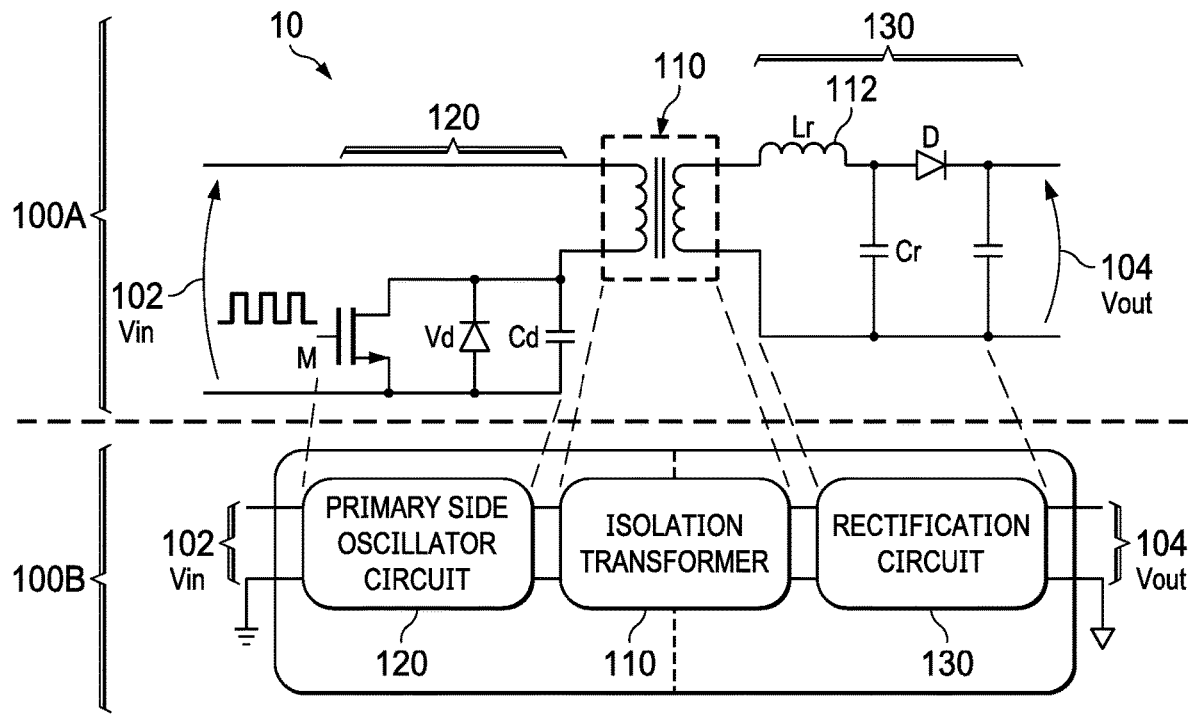
FIG. 2 is a simplified block diagram of one example configuration of the semiconductor package of FIGS. 1A-1C.

FIG. 2 depicts in a circuit schematic 100A and block diagram 100B for an example power supply with an isolation transformer, which may be incorporated into package 10 as circuit elements within conductive layers 24, 28 of laminate 20. The example power supply of FIG. 2 has an input voltage Vin 102 input to an input oscillation circuit 120, an isolation transformer 110 and an output rectification circuit 130 producing an output voltage Vout 104. The output circuit, called a tank circuit, also has an inductor 112. The power supply of FIG. 2 is a typical DC-DC converter circuit where oscillation circuit 120 oscillates with the input voltage Vin so that voltage can be transmitted through isolation transformer 110. Output voltage Vout 104, coupled through the transformer 110, is rectified by output rectification circuit 130.

A block diagram 100B of this power supply is shown with Vin 102 feeding into the primary side oscillation circuit 120 which is coupled to an isolation transformer 110. The secondary side of the transformer winding is coupled to output rectification circuit 130 which produces Vout 104. The power supply circuit of FIG. 2 features galvanic isolation via transformer 110 so that the voltage and current domains on each side of the transformer are independent.

In this example, laminate 20 includes a multilayer laminate isolation core on which the transformer 110 and inductor 112 are fabricated. Separate components comprising input oscillation circuit 120 and output rectification circuit 130 are then mounted on package 10. Such implementations of package 10 are less expensive than a power supply fabricated using traditional wound transformers. The resulting package 10 also takes up less board space and can be placed with common pick and place assembly equipment; all those factors lead to a lower cost, smaller product.

Moreover, as described with respect to FIG. 3, laminate magnet assembly 12 may be manufactured as part of an array of components. In alternative techniques, magnets are individually cut, the picked and placed for each package with a liquid adhesive such as epoxy, the liquid adhesive requiring separate curing steps for magnets on either side of the laminate. Accordingly, the bulk processes disclosed herein reduces steps required for the assembly of laminate 20 and magnetic layers 30, 40 and may further improve the alignment of magnetic layers 30, 40 relative to laminate 20.

FIG. 3 illustrates an assembly 212 including a laminate 220, which includes an array of circuit elements sandwiched between a patterned magnetic layer 230, and a second magnetic layer 240. In laminate 220, streets 223 form a grid separating each of the array of circuit elements, such as transformer coils. Each of the array circuit elements are contained within a single laminate 20 as described previously. Assembly 212 is cut along streets 223 to form laminate magnet assemblies 12.

Patterned magnetic layer 230 includes an array of magnetic center portions 32 interconnected by tie bars 234. Siderails 236 support center portions 32 along the edges of patterned magnetic layer 230. Siderails 236 also facilitate alignment of patterned magnetic layer 230 with laminate 220. In some examples, patterned magnetic layer 230, including openings 235 may be shaped by cutting a magnetic sheet to form openings 235, or molded with ceramic magnetic powder.

Within assembly 212, magnetic center portions 32 align with the array of individual circuit elements of laminate 220. Bond pads of the individual circuit elements are exposed within openings 235 of patterned magnetic layer 230. Patterned magnetic layer 230 is attached to an active side of laminate 220, the side including bond pads, while magnetic layer 240 is attached to an inactive side of laminate 220. In the illustrated example, of assembly 212 magnetic layer 240 is a solid sheet. In other examples, magnetic layer 240 may be replaced with a patterned magnetic layer, if desired to shape magnetic flux or expose portions of laminate 220.

Manufacture of assembly 212 includes first applying adhesive film 238 to patterned magnetic layer 230, such that openings 235 remain free of adhesive and then applying patterned magnetic layer 230 with adhesive film 238 to the active surface of laminate 220. Likewise, magnetic layer 240 is applied to the opposite surface of laminate 220 with adhesive film 248.

In a particular example, assembly 212 may be manufactured on a carrier tape. In such an example, magnetic layer 240 is first placed on the carrier tape, then laminate 220 is secured over magnetic layer 240 with adhesive film 248. Adhesive film 248 may be first applied to either laminate 220 or magnetic layer 240. As magnetic layer 240 is a magnetic sheet without openings, alignment between laminate 220 and magnetic layer 240 is not critical. Following the stacking of laminate 220 on magnetic layer 240, patterned magnetic layer 230 with adhesive film 238 is aligned with and secured to the active surface of laminate 220. For example, laminate 220 and/or patterned magnetic layer 230 may include alignment features to facilitate precise positioning of patterned magnetic layer 230 relative to laminate 220. Such alignment features may include notches, holes, and/or precisely defied edges.

Once magnetic layers 230, 240 are secured to either side of laminate 220, assembly 212 is ready for simulation. Singulation includes cutting along streets 223 to separate each laminate 20 from laminate 220. Magnetic layers 230, 240 are cut in unison with laminate 220. Cutting magnetic layer 230 cuts tie bars 234, leaving tie bar segments 34A, 34B, 34C, 34D extending from magnetic center portion 32 as described with respect to package 10. In addition, edge surfaces of both magnetic layers 30, 40 are aligned with edge surfaces of laminate 20 due to the unified cutting process. In some examples, cutting marks, such as grooves or other minute surface imperfections, may extend across edge surfaces of patterned magnetic layers 30, 40 and laminate 20.

Figure 4B:
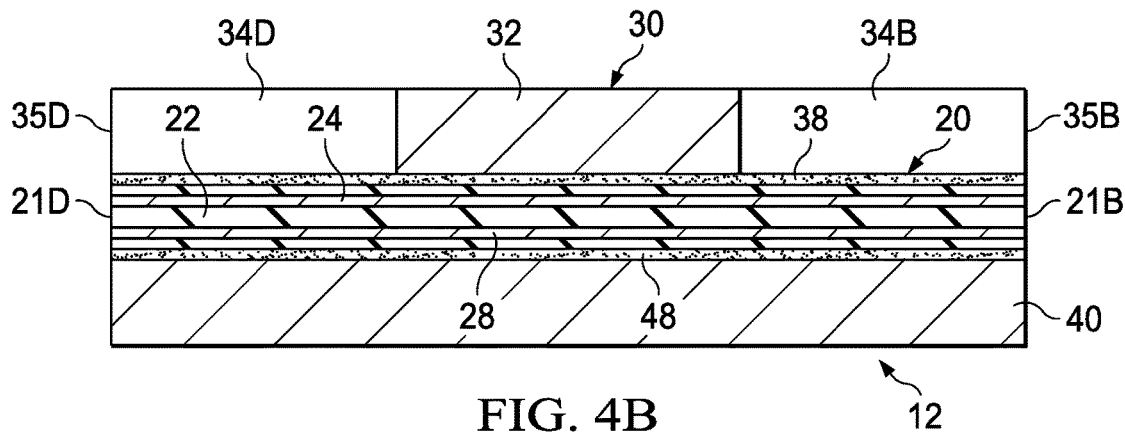
Figure 4A:
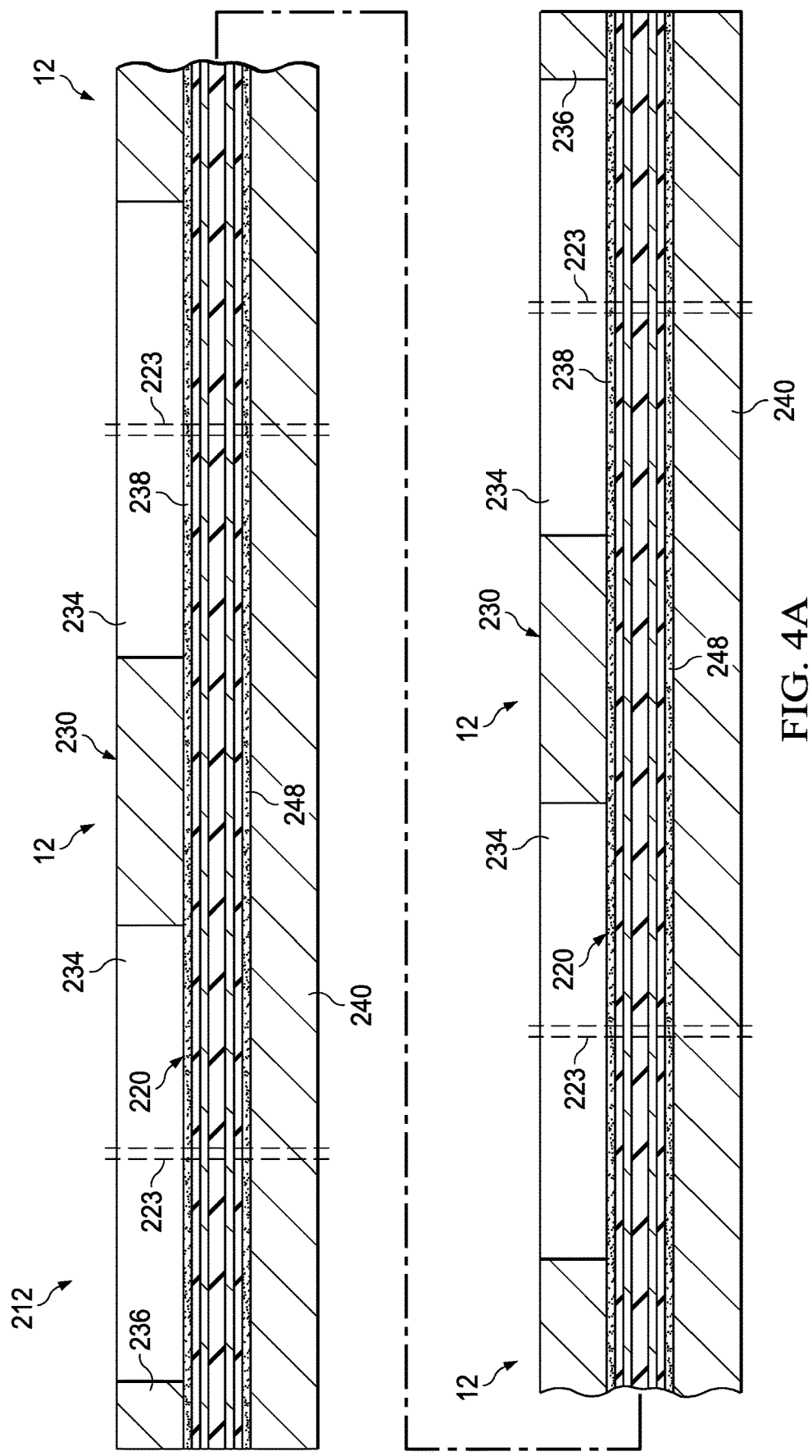
Figure 5:
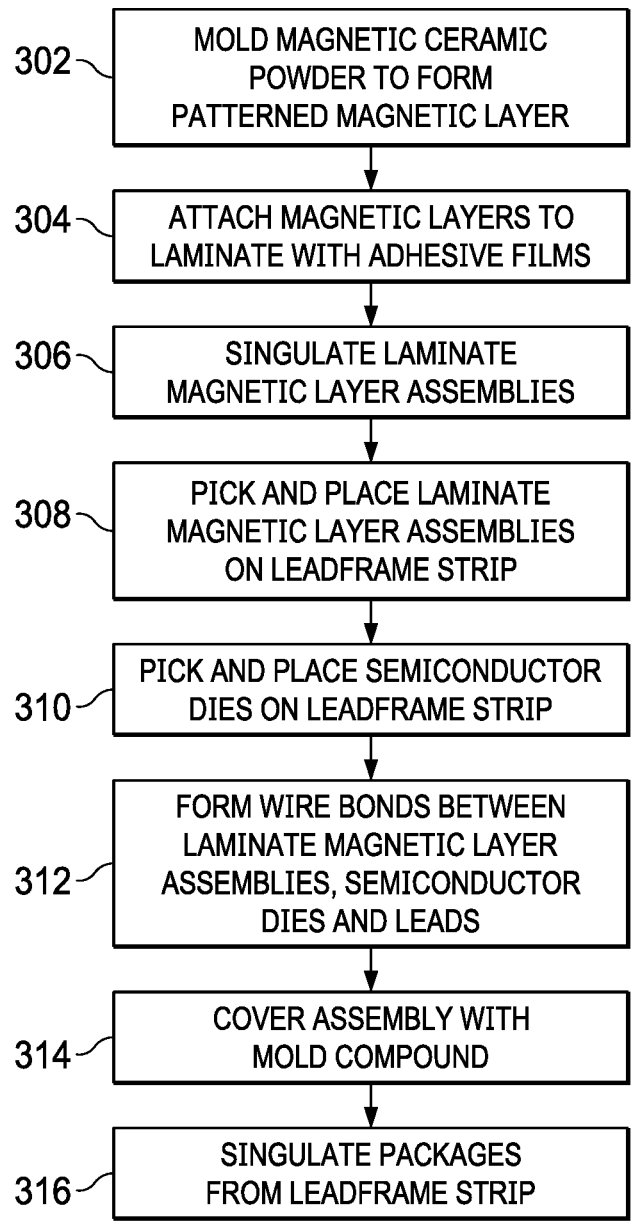
FIG. 5 is a flowchart of a method of batch manufacturing a package including magnetic material on both sides of a laminate circuit attached to a leadframe, such as the package of FIGS. 1A-1C.

FIGS. 4A-4F illustrate conceptual process steps for batch manufacturing package including package 10, and FIG. 5 is a flowchart of a method of batch manufacturing a package including with magnetic material on both sides of a laminate circuit. For clarity, the method of FIG. 5 is described with reference to package 10 and FIGS. 4A-4F; however, the described techniques may be adapted to other package designs and are not limited to the specific example of package 10.

FIG. 4A illustrates a side view of assembly 212 prior to singulation. Production of assembly 212 may include molding magnetic ceramic powder to form patterned magnetic layer 230 (FIG. 5, step 302). Forming assembly 212 further includes attaching magnetic layers 230, 240 to laminate 220 with adhesive films 238, 248 (FIG. 5, step 304). For example, attaching patterned magnetic layer 230 to laminate 220 with adhesive film 238 may include first applying adhesive film 238 to patterned magnetic layer 230, without covering opening 235, and then placing patterned magnetic layer 230 with adhesive film 238 against laminate 220.

As represented by FIG. 4B, assembly 212 is cut along streets 223 to singulate a plurality of laminate magnet assemblies 12 (FIG. 5, step 306). In this manner, attached patterned magnetic layers 230, 240 and laminate 220 are cut in unison to form laminate singulated laminate magnet assemblies 12 from assembly 212. Each of laminate magnet assemblies 12 include singulated circuit elements from laminate 220 with magnets cut from magnetic layers 230, 240 attached to the singulated circuit elements with the adhesive.

FIGS. 4C-4F only illustrate the components for a single package 10; however, the illustrated processes are performed together for each leadframe of a leadframe strip. A single leadframe includes pads and leads associated with a single package, such as pads 50, 51 and leads 55, and a leadframe strip includes multiple interconnected leadframes formed from a single sheet of substrate. The leadframe strip is formed on a single sheet of metal by stamping or etching. Leadframes on the sheet are arranged in rows and columns. Tie bars interconnect elements of a leadframe, such as pads 50, 51 and leads 55, to one another as well as to elements of adjacent leadframes. A siderail surrounds the array of leadframes to provide rigidity and support leadframe elements on the perimeter of the leadframe strip. The siderail may include alignment features to aid in manufacturing. Components, such as singulated laminate magnet assemblies 12 and semiconductor dies 60A, 60B, are mounted to each of the leadframes of leadframe strip.

As represented by FIG. 4C, singulated laminate magnet assemblies 12 are pick and placed on each leadframe of a leadframe strip (FIG. 5, step 308). Semiconductor dies 60A, 60B (FIG. 1B) are also are pick and placed on each leadframe of the leadframe strip (FIG. 5, step 310). As represented by FIG. 4D, wire bonds 27A, 27B, 57A, 57B are formed between laminate magnet assembly 12, leads 55 and semiconductor dies 60A, 60B (FIG. 5, step 312).

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The capillary is moved towards a lead bond pad 56 of leads 55 or bond pads of laminate 20 or semiconductor dies 60A, 60B. For a bond pad, the attachment area may be an alloy of aluminum and copper, for an attachment area of the leadframe, the attachment area may consist of the leadframe base metal or include one of the coating metal discussed above. The free air ball of melted wire is pressed against the metallization of the attachment area by a compression force, often combined with ultrasonic movement of the ball relative to the attachment area, transmitting ultrasonic energy, in order to create a ball bond.

After the ball attachment, the capillary with the wire may be lifted to span an arch from the ball bond, to an attachment area on a substrate or a leadframe, such as a lead stitch area of one of leads 55 or one of the bond pads of laminate 20 or semiconductor dies 60A, 60B. When the wire touches the attachment area surface, the capillary tip is pressed against the wire in order to flatten it and thus to form a stitch bond, sometimes referred to as a wedge bond.

As represented by FIG. 4E, laminate magnet assembly 12, semiconductor dies 60A, 60B, wire bonds 27A, 27B, 57A, 57B are covered with mold compound 70, such as by transfer molding the assembly of leadframe strip assembly in a common mold. The molding also at least partially covering the leadframe strip, including pads 50, 51 and leads 55 with the mold compound 70 (FIG. 5, step 314).

As represented by FIG. 4F, the leadframe strip is cut to singulate the plurality of semiconductor packages 10 (FIG. 5, step 316). For example, singulation may include cutting through tie bars of the leadframe strip, separating each package each other with a saw or other cutting implement, such as a laser. Leads 55 are bent into a gull wing shape to facilitate surface mounting of package 10. In some examples, a press may be used to both cut the leadframe strip to singulated packages 10 and bend leads 55 in a single operation.

FIG. 6 depicts in another cross section a portion of a printed circuit transformer 400. FIG. 6 depicts a cross section of a printed circuit transformer 400 starting with a bottom magnetic layer 410, followed by a copper clad lamination 420 with copper coils 422, lamination 420 can be a prepreg layer, for example. Note that in alternative arrangements, other conductors such as aluminum can be used in place of copper, and alloys including copper, aluminum or other materials for conductors can be used. Next, in the non-limiting example of FIG. 6, is a dielectric core 430 followed by another copper clad lamination 440 with copper layer 442. Another copper clad lamination 450 with copper coil 452 is then followed by lamination 460. The top layer of transformer 400 in FIG. 6 is upper magnetic layer 412.

In the cross section of FIG. 6, copper coils 422, 452 can be formed into the primary and secondary coils of an isolation transformer, for example, as described above. Magnetic layers 410, 412 serve to contain the magnetic flux. Copper layer 442 forms at least one plane that creates an integrated electromagnetic interference (EMI) shield connected to ground 444. Copper layer 442 can be a slotted plane to further suppress eddy currents. The goal of the use of copper layer 442 is to block electric field but allow magnetic coupling between the primary and secondary sides of the transformer. In additional arrangements, at least one additional copper plane (not shown) is formed for additional EMI shielding, and this at least one additional copper plane is isolated from each of the first and second sides of the transformer and copper layer 442.

Magnetic layer 412 is a patterned magnetic layer as described with respect to patterned magnetic layer 30. In addition, magnetic layers 410, 412 may be cut in unison with the lamination layers as part of a batch manufacturing process as described with respect to laminate 20, and magnetic layers 30, 40 with reference to FIG. 4A. For brevity, details described with respect to laminate 20, and magnetic layers 30, 40 are not repeated for the lamination and magnetic layers of FIG. 6.

In an alternative approach for a transformer, arranged without the magnetic layers of the arrangements of the present application, and using the air core dielectric of a printed circuit transformer, the limiting factors include that placing copper layer 442 as an EMI shield requires larger separation between the primary and secondary coils of the transformer, which results in reduced coupling between the coils, and this reduced coupling further reduces efficiency and power transfer between the coils. In an alternative approach, use of copper layer 442 as an EMI shield would reduce the coupling between copper coils 422, 452 and therefore reduce performance.

In contrast, with the inclusion of the magnetic layers 410, 412 in the structure shown in FIG. 6, the magnetic flux is more focused, providing good coupling between the transformer coils even with a larger separation between the coils. Because magnetic layer 410 on the bottom of the structure allows for placement of isolation transformer 400 in full contact on a die attach pad without a void, excellent thermal transfer can be achieved, further increasing performance. The thermal energy can be conducted into and transported out of the package by the leadframe that magnetic layer 410 is placed in contact with. Further the upper layer of magnetic material can be used to increase thermal transfer. For example, a thermal slug or other thermally conductive material such as a thermal pad can be placed in contact with upper layer 412 and thereby provide additional thermal dissipation from a packaged device.

In an alternative arrangement, an additional EMI shield (not shown in FIG. 6) can be used to further increase the performance of the arrangements. Use of two or more EMI shields placed between the upper layer of magnetic material and the lower layer of magnetic material forms additional arrangements that are also contemplated as forming aspects of the present application, and which fall within the scope of the present application.

Figure 7:
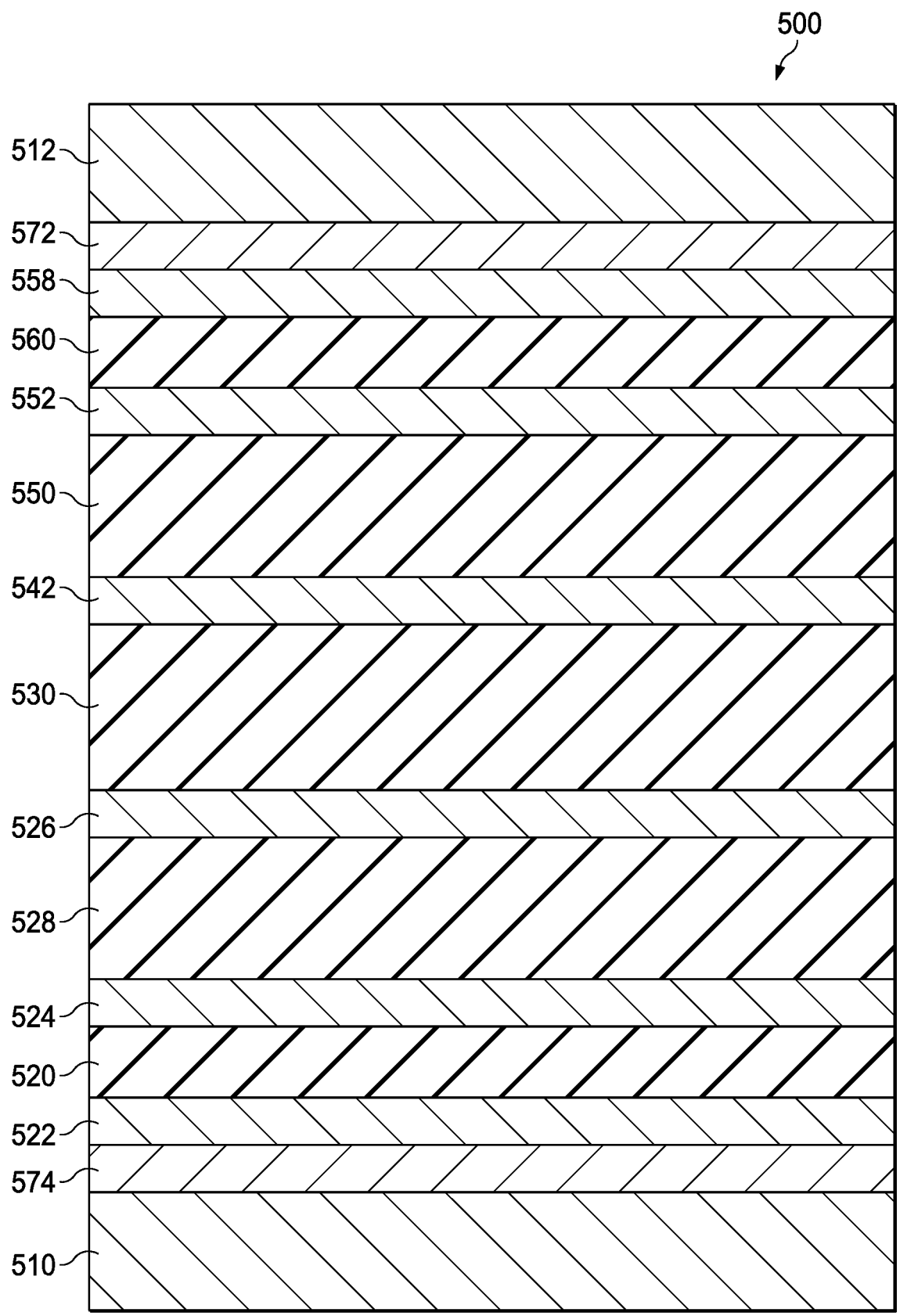
FIG. 7 depicts in another cross-sectional view details of an additional arrangement for an isolation transformer of the present application.

FIG. 7 depicts in a cross-sectional view of a laminate structure 500 illustrating further details of an example arrangement that can be incorporated into isolation structures and circuits. In this non-limiting example, a dielectric core 530, which corresponds to dielectric core 430 in the previous figure, and which has in a non-limiting example a thickness of about 60 microns, can be formed of BT resin, for example. As used herein, the term, "about" means within the range of manufacturing tolerances associated with the particular element being described numerically.

A set of layers of prepreg material and metal layers are shown arranged on both sides of core 530. For example, metal layer 542 is formed on an upper surface of core 530 and can be, in this non-limiting example, about 25 microns thick. Other thicknesses can be used to form additional alternatives. The metal can be any conductor but may be, for example formed of copper or copper alloys or aluminum. Additional layers above core 530 include prepreg layer 550 and another metal layer 552, followed by another prepreg layer 560 and copper layer 558. A soldermask layer 572 overlies and protects the upper surface of copper layer 558. Upper magnetic layer 512 is then shown disposed over soldermask layer 572. In an example arrangement the upper magnetic layer can be of about 300 microns thick, however, in alternative arrangements, upper magnetic layer 512 can be of other thicknesses.

Continuing to describe the example arrangement of FIG. 7, layers formed starting on the bottom surface of core 530 include, for example, a series of metal layers including 526, 524, 522 separated by prepreg layers 528, 520, and finally a soldermask layer 574 is disposed beneath the bottom surface of the bottom metal layer 522. The metal layers in this non-limiting, illustrative example include copper metal layers of thickness of about 25 microns. The prepreg layers can have various thicknesses, for example between or including 45 microns and 55 microns. The soldermask layer can be about 50 microns in this example although more, and less, thicknesses can be used to form additional alternative arrangements.

Bottom magnetic layer 510 is shown disposed on the bottom surface of soldermask layer 574 and is about 300 microns thick in this illustrative example. Use of the magnetic materials in the arrangements contain and control the flux from the transformer coils formed in the metal layers, increasing performance, and reducing EMI in circuits positioned near the transformer. The use of the magnetic layers allows for increased thermal performance due to the ability to position the magnetic material in direct contact with die pad attach material on a leadframe, to allow for efficient thermal transfers.

While FIG. 7 depicts an example arrangement that forms an aspect of the present application, the arrangements and the present application and the appended claims are not limited to the examples shown, and alternatives with different materials, different thicknesses, and more or fewer layers can be used to form additional arrangements that are also contemplated as forming additional aspects of the present application and which fall within the scope of the appended claims.

Figure 8:
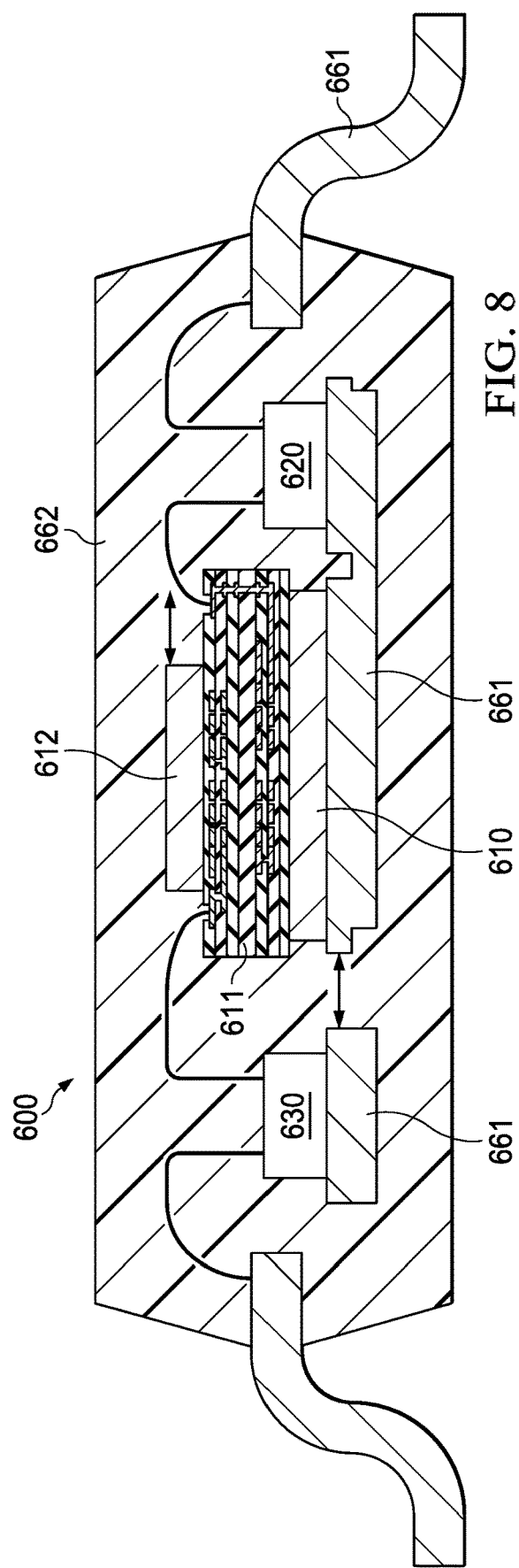
FIG. 8 depicts in a cross sectional view a packaged integrated circuit arrangement incorporating the isolation laminate and magnetic layers of the present application.

FIG. 8 depicts in a cross sectional view a packaged integrated circuit 600 including the magnetic layers and isolation transformers of the novel arrangements in an example application. In FIG. 8, a first semiconductor die 620 may include, for example, integrated circuitry for a primary side circuit in a power supply. Semiconductor die 620 can be positioned on a die attach pad on a leadframe 661.

An isolation structure 611 includes a magnetic layer 610 on the bottom surface and an upper magnetic layer 612 over the laminated isolation structure. Isolation structure 611 is disposed on and in thermal contact with a second die attach pad on leadframe 661. In an alternative arrangement, however, isolation structure 611 could be placed on a portion of the leadframe with secondary circuit 630. A secondary circuit is formed in a second semiconductor die 630 that is disposed on a separate portion of leadframe 661 and is electrically isolated from the transformer portion.

Leadframe 661 and the components including primary semiconductor die 620, secondary semiconductor die 630, and isolation structure 611, are all encapsulated by mold compound 662.

The completed packaged integrated circuit is shown, in this non-limiting example, in a Small Outline Integrated Circuit (SOIC) package, however other package types used in the semiconductor industry can also be used with the arrangements. The arrangements are formed with the purpose of providing efficient and highly integrated power transfers through an isolation barrier.

The specific techniques for packages including a laminate with a circuit element and one or more magnets over the circuit element, such as package 10, printed circuit transformer 400, laminate structure 500, and packaged integrated circuit 600, are merely illustrative of the general inventive concepts included in this disclosure as defined by the following claims. For example, the techniques of the present application can be used for various applications such as power supplies, sensors, driver integrated circuits, indicators, control panels, and the like, and the use of the arrangements in these applications are contemplated by the inventors as forming additional aspects of the present application.

What is claimed is:

1. An apparatus comprising:
    a laminate including:
        a dielectric layer having a first surface and a second surface opposed to the first surface;
        a first conductive layer forming a circuit element overlying the first surface of the dielectric layer; and
        a second conductive layer overlying the second surface of the dielectric layer;

a patterned first magnetic layer over the first conductive layer;

a second magnetic layer over the second conductive layer;

wherein a first edge surface of the patterned first magnetic layer is coplanar with a first edge surface of the laminate; and wherein a second edge surface of the patterned first magnetic layer is coplanar with a second edge surface of the laminate;

wherein a first edge surface of the second magnetic layer is coplanar with the first edge surface of the laminate;

wherein a second edge surface of the second magnetic layer is coplanar with the second edge surface of the laminate;

wherein the circuit element includes a first transformer coil overlying the first surface of the dielectric layer;

wherein the second conductive layer forms a second transformer coil overlying the second surface of the dielectric layer; and wherein the laminate further includes a third conductive layer forming an electromagnetic interference (EMI) shield between and isolated from the first conductive layer and the second conductive layer.

2. The apparatus of claim 1, further comprising an adhesive film between the laminate and the magnetic layer.

3. The apparatus of claim 1, wherein the dielectric layer is a first dielectric layer, the laminate further including a second dielectric layer between the conductive layer and the magnetic layer.

4. An apparatus comprising:
a laminate including:
a dielectric layer having a first surface and a second surface opposed to the first surface; and
a conductive layer forming a circuit element overlying the first surface of the dielectric layer; and
a magnetic layer over the conductive layer, wherein the magnetic layer includes a first tie bar segment forming the first edge surface of the magnetic layer, a second tie bar segment forming the second edge surface of the magnetic layer, and a center portion between the first tie bar segment and the second tie bar segment, the center portion being wider than either the first tie bar segment or the second tie bar segment,
wherein a first edge surface of the magnetic layer is coplanar with a first edge surface of the laminate, and
wherein a second edge surface of the magnetic layer is coplanar with a second edge surface of the laminate.

5. An apparatus comprising:
a laminate including:
a dielectric layer having a first surface and a second surface opposed to the first surface; and
a conductive layer forming a circuit element overlying the first surface of the dielectric layer, wherein the conductive layer forms bond pads providing electrical connections to the circuit element; and
a magnetic layer over the conductive layer, the magnetic layer not covering the bond pads,
wherein a first edge surface of the magnetic layer is coplanar with a first edge surface of the laminate, and
wherein a second edge surface of the magnetic layer is coplanar with a second edge surface of the laminate.

6. An apparatus comprising:
a laminate including:
a dielectric layer having a first surface and a second surface opposed to the first surface; and
a conductive layer forming a circuit element overlying the first surface of the dielectric layer, wherein the conductive layer forms bond pads providing electrical connections to the circuit element; and
a magnetic layer over the conductive layer, the magnetic layer not covering the bond pads;
wherein a first edge surface of the magnetic layer is coplanar with a first edge surface of the laminate;
wherein a second edge surface of the magnetic layer is coplanar with a second edge surface of the laminate;
a metallic pad and leads, wherein the laminate is mounted to the metallic pad with the second surface of the laminate facing the metallic pad; and
a wire bond extending between a first lead of the leads and a first bond pad of the bond pads.

7. The apparatus of claim 6, wherein the wire bond is a first wire bond, the apparatus further comprising:
a semiconductor die mounted to the metallic pad adjacent to the laminate; and
a second wire bond extending between a second bond pad of the bond pads and the semiconductor die.

8. The apparatus of claim 7, further comprising mold compound covering the laminate, the magnetic layer, the semiconductor die, the first wire bond, the second wire bond, and at least partially covering the metallic pad and the leads.

9. An apparatus comprising:
a laminate including:
a dielectric layer having a first surface and a second surface opposed to the first surface; and
a conductive layer forming a circuit element overlying the first surface of the dielectric layer; and
a magnetic layer over the conductive layer,
wherein a first edge surface of the magnetic layer is coplanar with a first edge surface of the laminate,
wherein a second edge surface of the magnetic layer is coplanar with a second edge surface of the laminate; and
cutting marks extending across the first edge surface of the magnetic layer and the first edge surface of the laminate, the cutting marks indicating the magnetic layer and the laminate were assembled prior to a cutting operation forming the cutting marks.

10. An apparatus comprising:
a laminate including:
a dielectric layer having a first surface and a second surface opposed to the first surface;
a first conductive layer forming a first transformer coil overlying the first surface of the dielectric layer; and
a second conductive layer forming a second transformer coil overlying the second surface of the dielectric layer;
a patterned magnetic layer over the first conductive layer,
wherein a first edge surface of the patterned magnetic layer is coplanar with a first edge surface of the laminate, and
wherein a second edge surface of the first magnetic layer is coplanar with a second edge surface of the laminate; and
a non-patterned magnetic layer over the second conductive layer,
wherein a first edge surface of the non-patterned magnetic layer is coplanar with the first edge surface of the laminate, and
wherein a second edge surface of the second magnetic layer is coplanar with the second edge surface of the laminate.

11. An apparatus comprising:
a laminate including:
- a dielectric layer having a first surface and a second surface opposed to the first surface;
- a first conductive layer forming a first transformer coil overlying the first surface of the dielectric layer; and
- a second conductive layer forming a second transformer coil overlying the second surface of the dielectric layer;

a first magnetic layer over the first conductive layer,
wherein a first edge surface of the first magnetic layer is coplanar with a first edge surface of the laminate, and
wherein a second edge surface of the first magnetic layer is coplanar with a second edge surface of the laminate; and
a second magnetic layer over the second conductive layer,
wherein a first edge surface of the second magnetic layer is coplanar with the first edge surface of the laminate, and
wherein a second edge surface of the second magnetic layer is coplanar with the second edge surface of the laminate;
wherein the first conductive layer forms a first set of bond pads providing electrical connections to the first transformer coil and a second set of bond pads providing electrical connections to the second transformer coil, the first magnetic layer not covering the bond pads;
a first metallic pad, a second metallic pad and leads, the second metallic pad being electrically isolated from the first metallic pad,
wherein the laminate is mounted to the first metallic pad with the second surface of the laminate facing the metallic pad;
a first semiconductor die mounted to the first metallic pad adjacent to the laminate;
a second semiconductor die mounted to the second metallic pad;
a first set of wire bonds electrically connecting the first semiconductor die and the first set of bond pads; and
a second set of wire bonds electrically connecting the second semiconductor die and the first set of bond pads.

12. The apparatus of claim 11, further comprising mold compound covering the laminate, the first magnet, the second magnet, the first semiconductor die, the second semiconductor die, the first set of wire bonds, the second set of wire bonds, and at least partially covering the first metallic pad, the second metallic pad and the leads.

13. An apparatus comprising:
a laminate including:
- a dielectric layer having a first surface and a second surface opposed to the first surface;
- a first conductive layer forming a first transformer coil overlying the first surface of the dielectric layer; and
- a second conductive layer forming a second transformer coil overlying the second surface of the dielectric layer;

a first magnetic layer over the first conductive layer,
wherein a first edge surface of the first magnetic layer is coplanar with a first edge surface of the laminate, and
wherein a second edge surface of the first magnetic layer is coplanar with a second edge surface of the laminate; and
a second magnetic layer over the second conductive layer,
wherein a first edge surface of the second magnetic layer is coplanar with the first edge surface of the laminate, and
wherein a second edge surface of the second magnetic layer is coplanar with the second edge surface of the laminate; and
wherein the first magnetic layer and the second magnetic layer are configured to confine and focus flux between the first transformer coil and the second transformer coil to increase an effective inductance between the first transformer coil and the second transformer coil by at least a factor of two.

14. A method comprising:
attaching a patterned magnetic layer to a laminate with an adhesive to form a laminate magnet assembly, the laminate including:
- a dielectric layer having a first surface and a second surface opposed to the first surface;
- a conductive layer forming an array of circuit elements and bond pads overlying the first surface of the dielectric layer, the bond pads providing electrical connections to each of the array of circuit elements,
wherein the patterned magnetic layer includes openings with the bond pads exposed within the openings; and
cutting the attached patterned magnetic layer and the laminate in unison to form laminate magnet assemblies, each of the laminate magnet assemblies including singulated circuit elements with magnets cut from the patterned magnetic layer attached to the singulated circuit elements with the adhesive.

15. The method of claim 14, wherein the adhesive is an adhesive film, wherein attaching the patterned magnetic layer to the laminate with the adhesive including first applying the adhesive film to the magnetic layer, and then placing the patterned magnetic layer with the adhesive film against the laminate.

16. The method of claim 14,
wherein the patterned magnetic layer is a first magnetic layer, the adhesive is a first adhesive layer, and the conductive layer is a first conductive layer, and
wherein the laminate further includes a second conductive layer overlying the second surface of the dielectric layer,
the method further comprising attaching a second magnetic layer over the second conductive layer with a second adhesive layer,
wherein cutting the attached patterned magnetic layer and the laminate in unison includes cutting the first magnetic layer, the second magnetic layer, and the laminate in unison.

17. The method of claim 16,
wherein the first conductive layer forms a first transformer coil overlying the first surface of the dielectric layer,
wherein the second conductive layer forms a second transformer coil overlying the second surface of the dielectric layer, and
wherein the first magnetic layer and the second magnetic layer are configured to confine and focus flux between the first transformer coil and the second transformer coil to increase an effective inductance between the first transformer coil and the second transformer coil by at least a factor of two.

18. The method of claim 14, further comprising:
picking and placing the singulated circuit elements on a leadfame strip;
picking and placing a plurality of semiconductor dies on the leadframe strip;
forming wire bonds between the bond pads of the singulated circuit elements and the semiconductor dies; and singulating the leadframe strip to form a plurality of semiconductor packages, each of the plurality of semiconductor packages including at least one of the singulated circuit elements, at least one of the plurality of semiconductor dies, and at least one of the wire bonds.

19. The method of claim 18, further comprising, prior to singulating the leadframe strip to form the plurality of semiconductor packages, covering the singulated circuit elements, the plurality semiconductor dies, and the wire bonds with mold compound and at least partially covering the leadframe strip with the mold compound.

20. The method of claim 14, further comprising molding magnetic ceramic powder to form the patterned magnetic layer.

* * * * *